(12) United States Patent
Hirose

(10) Patent No.: US 7,221,291 B2
(45) Date of Patent: May 22, 2007

(54) CHARACTER STRING RETRIEVING CIRCUIT AND CHARACTER STRING RETRIEVING METHOD

(75) Inventor: Toshiyuki Hirose, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/383,308

(22) Filed: May 15, 2006

(65) Prior Publication Data

US 2006/0261988 A1    Nov. 23, 2006

(30) Foreign Application Priority Data

May 23, 2005    (JP) ............................. 2005-149713

(51) Int. Cl.
*H03M 7/34*    (2006.01)
*H03M 7/38*    (2006.01)

(52) U.S. Cl. .......................................... 341/51; 341/50

(58) Field of Classification Search .................. 341/51, 341/50

See application file for complete search history.

(56) References Cited

U.S. PATENT DOCUMENTS

| | | | | |
|---|---|---|---|---|
| 5,627,533 A | * | 5/1997 | Clark | ........................... 341/51 |
| 5,929,791 A | * | 7/1999 | Masenas | ........................ 341/51 |
| 6,181,592 B1 | * | 1/2001 | Aoki | ............................ 365/49 |
| 6,490,279 B1 | * | 12/2002 | Chen et al. | ................. 370/392 |
| 6,629,250 B2 | * | 9/2003 | Kopser et al. | .............. 713/401 |
| 7,095,341 B2 | * | 8/2006 | Hsiun | .......................... 341/67 |

* cited by examiner

*Primary Examiner*—Peguy JeanPierre
(74) *Attorney, Agent, or Firm*—Oblon, Spivak, McClelland, Maier & Neustadt, P.C.

(57) ABSTRACT

A character string retrieving circuit includes a delay circuit (10) for delaying a match/no match signal created in each clock period to indicate whether or not a character matched with a retrieval target exists in a dictionary by one clock period, creating circuits ($2(i)$, $3(i)$, $5(i)$ and $6(i)$) for creating in advance signals of two kinds of a signal ($ps1[i]$) to assume that a character matched with a retrieval target exists in a dictionary in the clock period and a signal ($ps0[i]$) to assume that a character matched with a retrieval target does not exist in a dictionary in the clock period as signals to predict retrieved results in a certain clock period later and a selecting circuit ($4(i)$) for selecting a signal with a correct assumption from the signals of 2 kinds in accordance with the match/no match signal delayed by the delay circuit (10), wherein a signal selected by the selecting circuit ($4(i)$) is used in the next clock period. Thus, in the character string retrieving circuit provided within a data compressing circuit using the LZ77 method, faster character string retrieval can be realized based on pipeline processing.

3 Claims, 8 Drawing Sheets

FIG. 1 (RELATED ART)

| Address | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Dictionary | A | B | C | C | A | B | C | C | C | A | B | C | A | B | C | C |

FIG. 3 (RELATED ART)

```
ps_and_ml[i] = ps[i - 1] & ml[i];
if (orfb) {
    ps[i] <= ps_and_ml[i];
}
else {
    ps[i] <= ml[i]; // discard last retrieved result if retrieval character string is not found
}
match_address = ps_and_ml[i] ; // match address
match = | ps_and_ml[i]; // set "1" if retrieval character string is found
orfb = match;
```

| Address    | 0 | 1 | 2 | 3 | 4 | 5 | 6 | 7 | 8 | 9 | 10 | 11 | 12 | 13 | 14 | 15 |
|------------|---|---|---|---|---|---|---|---|---|---|----|----|----|----|----|----|
| Dictionary | A | B | C | C | A | B | C | C | C | A | B  | C  | A  | B  | C  | C  |
| ml[i]      | 1 | 0 | 0 | 0 | 1 | 0 | 0 | 0 | 0 | 1 | 0  | 0  | 1  | 0  | 0  | 0  |
| ps1[i−1]   | 0 | 0 | 0 | 1 | 0 | 0 | 0 | 1 | 0 | 0 | 0  | 0  | 1  | 0  | 0  | 1  |
| ps[i]      | 0 | 0 | 0 | 0 | 0 | 0 | 0 | 0 | 0 | 0 | 0  | 0  | 1  | 0  | 0  | 0  |

FIG. 7

```
ps1_and_ml[i] = ps1[i - 1] & ml[i];
ps0_and_ml[i] = ps0[i - 1] & ml[i];
if (orfb_d) {
   // ps1 is correct answer
   ps1[i] <= ps1_and_ml[i];
   ps0[i] <= ml[i];
   match_address_d <= ps1_and_ml;
   match_d <= |ps1_and_ml;
}
else {
   // ps1 is correct answer
   ps1[i] <= ps0_and_ml[i];
   ps0[i] <= ml[i];
   match_address_d <= ps0_and_ml;
   match_d <= |ps0_and_ml;
}
orfb_d = match_d;
```

FIG. 8

| Address | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Dictionary | A | B | C | C | A | B | C | C | C | A | B | C | A | B | C | C |
| ml[i] | 1 | 0 | 0 | 0 | 1 | 0 | 0 | 0 | 0 | 1 | 0 | 0 | 1 | 0 | 0 | 0 |
| ps1[i−1] | 0 | 0 | 0 | 1 | 0 | 0 | 0 | 1 | 0 | 0 | 0 | 0 | 1 | 0 | 0 | 1 |
| ps1[i] | 0 | 0 | 0 | 0 | 0 | 0 | 0 | 0 | 0 | 0 | 0 | 0 | 1 | 0 | 0 | 0 |
| ps0[i−1] | 1 | 0 | 0 | 1 | 1 | 0 | 0 | 1 | 1 | 1 | 1 | 0 | 1 | 0 | 0 | 1 |
| ps0[i] | 1 | 0 | 0 | 0 | 1 | 0 | 0 | 0 | 0 | 1 | 0 | 0 | 1 | 0 | 0 | 0 |

FIG. 9

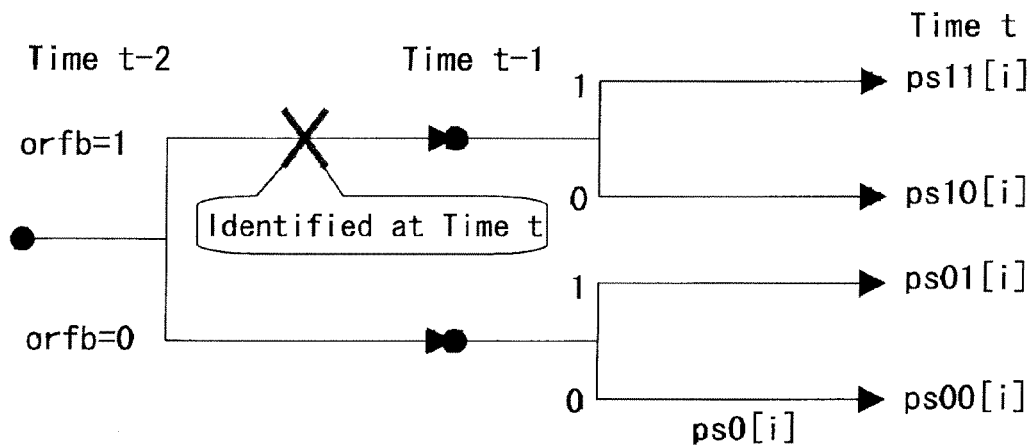

FIG. 10

```
ps11_and_ml[i] = ps11[i - 1] & ml[i];
ps10_and_ml[i] = ps10[i - 1] & ml[i];
ps01_and_ml[i] = ps01[i - 1] & ml[i];
ps00_and_ml[i] = ps00[i - 1] & ml[i];
if (orfb_d2) {
   // ps11 or ps10 is correct answer
   ps11[i] <= ps11_and_ml[i];
   ps10[i] <= ml[i];
   ps01[i] <= ps10_and_ml[i];
   ps00[i] <= ml[i];
   match1_d <= |ps11_and_ml;
   match0_d <= |ps10_and_ml;
   match_d2 <= match1_d;
}
else {
   // ps01 or ps00 is correct answer
   ps11[i] <= ps01_and_ml[i];
   ps10[i] <= ml[i];
   ps01[i] <= ps00_and_ml[i];
   ps00[i] <= ml[i];
   match1_d <= |ps01_and_ml;
   match0_d <= |ps00_and_ml;
   match_d2 <= match0_d;
}
orfb_d2 = match_d2;
```

CHARACTER STRING RETRIEVING CIRCUIT AND CHARACTER STRING RETRIEVING METHOD

CROSS REFERENCES TO RELATED APPLICATIONS

The present invention relates to subject matter related to Japanese Patent Application JP 2005-149713 filed in the Japanese Patent Office on May 23, 2005, the entire contents of which being incorporated herein by reference.

BACKGROUND OF THE INVENTION

1. Field of the Invention

The present invention relates to a character string retrieving circuit provided within a data compressing circuit using a LZ (Lempel-Ziv) 77 method, and particularly to a character string retrieving circuit which can make character string retrieving processing become faster.

2. Description of the Related Art

A LZ77 method exists as a kind of dictionary type data compression algorithms. The LZ77 method is used in data compressing circuits within various kinds of data recording apparatus such as an ALDC (Adaptive Lossless Data Compression) within AIT format, S-AIT format or LTO format tape drive (see Cited Patent Reference 1, for example).

A data compression principle of the LZ77 method will be described. That is, a last character string of a predetermined size of character strings (data strings) that have been inputted is registered on a dictionary, a character string that is matched with a newly inputted character string (that is, character string to be compressed) is retrieved from the dictionary and the newly inputted character string is replaced with address information of the match character string. This dictionary is not a static type dictionary but it is updated so as to exclude an old character string by adding the character string just before the compressed character string in accordance with a progress of data compression. Hence, this dictionary is called a sliding dictionary.

FIG. 1 of the accompanying drawings is a schematic diagram showing an example of the manner in which a character string is retrieved from this dictionary. Although it has been customary that the dictionary is 512 bytes, 1024 bytes or 2048 bytes in size, this dictionary is 16 bytes in size for simplicity of explanation. As shown in FIG. 1, a last character string "ABCCAB . . . BCC" (each of the characters A, B, C is one byte) of 16 characters of character strings that had been inputted in the past is registered as a dictionary. The character "A" that was inputted 16 bytes before is assigned an address 0, the character "B" that was inputted 15 bytes before is assigned an address 1 and the character "C" that was inputted one byte before is assigned an address 15.

When the newly inputted character string is "ABCA", for example, a character string of addresses 9 to 12 is matched with "ABCA". In this case, the address 12 is outputted as a match address (address defined as the end address of the matched character string). In the end, the character string "ABCA" of 4 bytes is compressed to 2 bytes by replacing the character string "ABCA" with the leading address 9 and a match length 4.

Also, when a newly inputted character string is "ABC", for example, a character string of addresses 0, 1, 2, a character string of addresses 4, 5, 6, a character string of addresses 9, 10, 11 and a character string of addresses 12, 13, 14 are matched with the character string "ABC", respectively.

Further, for example, when a newly entered character string is "ABC", a character string of addresses 0, 1, 2, a character string of addresses 4, 5, 6, a character string of addresses 9, 10, 11 and a character string of addresses 12, 13 and 14 are respectively matched with the character string "ABC". Accordingly, in this case, 2, 6, 11 and 14 are outputted as match addresses (addresses defined as the end addresses of the match character strings).

As described above, according to the LZ77 method, data can be compressed by retrieving the character strings matched with the character string to be compressed from the dictionary. To this end, a character string retrieving circuit for carrying out this retrieving processing is provided within a data compressing circuit.

FIG. 2 is a block diagram showing an arrangement of a character string retrieving circuit provided within a data compressing circuit using the LZ77 method according to the related art.

As shown in FIG. 2, this character string retrieving circuit includes N sets of a circuit group composed of comparing circuits $51(i)$, two-input and one-output AND circuits $52(i)$, two-input and one-output multiplexers $53(i)$ and D flip-flop circuits $54(i)$ in response to respective addresses i (i=0 to N−1) of a dictionary of which size is N bytes provided within a memory (for example, a SRAM (static random-access memory)), not shown. Also, this character string retrieving circuit according to the related art includes an N-input and one-output OR circuit 55.

The respective comparing circuits $51(i)$ compare a character to be retrieved with characters of corresponding addresses i of a dictionary and output compared results m [i] (that is, outputs go to "1" if the character to be retrieved is matched with the character of the corresponding addresses i of the dictionary and which go to "0" if not). The resultant compared results m [i] are supplied to one input terminals of the AND circuits $52(i)$ of the same set and they are also supplied to input terminals S2 of the multiplexers $53(i)$ of the same set.

The AND circuits $52(i)$ are supplied at the other input terminals thereof with outputs ps [i−1] which are outputs of the D flip-flop circuits $54(i)$ of the sets corresponding to one address before the address of the dictionary. For example, if the AND circuits $52(i)$ are AND circuits 52 (N−1), then outputs ps [N−2] which are outputs from D flip-flop circuits 53 (N−2) are supplied to the other input terminals of the AND circuits 52 (N−1). Outputs ps_and_m[i] (called "match") from the AND circuits $52(i)$ are supplied to the input terminals S1 of the multiplexers $53(i)$ of the same set and they are also supplied to the OR circuit 55.

An output orfb (that is, or feed back) from the OR circuit 55 is supplied to selection control terminals C of the multiplexers $53(i)$ of each set. This output orfb goes to "1" if any one match of ps_and_m [0] to ps_and_m [N−1] is "1" (if any one character string matched with the character string to be retrieved this time exists in the dictionary) and it goes to "0" if all of the outputs ps_and_m [0] to ps_and_m [N−1] are "0" (if the character string matched with the character string to be retrieved this time does not exist in the dictionary). That is, the output orfb is a match/no match signal which shows whether or not a character matched with a retrieval target character exists in the dictionary in each clock period.

The multiplexers $53(i)$ select the outputs ps_and_m [i] supplied to the input terminals S1 and output the outputs ps_and_m [i] from the output terminals D if the outputs orfb are "1". If on the other hand this outputs orfb are "0", then the multiplexers $53(i)$ select the outputs m [i] supplied to the input terminals S2 and output the outputs m [i] from the output terminals D. The outputs from the multiplexers 53(*i*) are supplied to the D input terminals of the D flip-flop circuits 54 (*i*) of the same set and these outputs are held at their output terminals Q until the next signal is inputted thereto. The outputs ps [i] held at the output terminals Q of the D flip-flop circuits 54(*i*) are supplied to the AND circuits 52(*i*) of the sets corresponding to one address after the address of the dictionary as outputs ps [i−1].

While FIG. 2 shows the block diagram of the character string retrieving circuit according to the related art, when this character string retrieving circuit is designed as an ASIC (Application Specified Integrated Circuit) or a programmable logic device (that is, FPGA (Field Programmable Gate Array), etc.), this character string retrieving circuit can be described as shown in FIG. 3 by using a Verilog HDL that is a kind of hardware description languages.

This character string retrieving circuit retrieves a character matched with a character of an inputted character string from a dictionary with respect to each character of the inputted character string every time (one period of operation clock) and creates the output orfb which shows whether or not a character matched with the retrieval target character exists in the dictionary. If the character matched with the retrieval target character exists in the dictionary, then the character string retrieving circuit increments the number of the characters to be retrieved one by one by using the retrieved result at the next clock period.

Specifically, if the newly entered character string is "ABCA", for example, then this character string retrieving circuit carries out retrieval in the following procedure.

FIRST RETRIEVAL: Retrieve a character matched with the first character "A" from the dictionary;

SECOND RETRIEVAL: Retrieve a character matched with the second character "B" from the dictionary if the character matched with "A" exists in the dictionary and retrieve a character string matched with "AB" by using the preceding retrieved result of "A";

THIRD RETRIEVAL: Retrieve a character matched with the third character "C" from the dictionary if the character string matched with "AB" exists in the dictionary and retrieve a character string matched with "ABC" by using the preceding retrieved result of "AB"; and FOURTH RETRIEVAL: Retrieve a character matched with the fourth character "A" from the dictionary if the character string matched with "ABC" exists in the dictionary and retrieve the character string matched with "ABCA" by using the preceding retrieved result of "ABC".

FIG. 4 is a diagram showing operations of this character string retrieving circuit with reference to an example of the case in which the character string "ABCA" is retrieved (aforementioned fourth retrieval) by using the retrieved result of the character string "ABC" in the process to retrieve the character string "ABCA" from the dictionary shown in FIG. 1.

As shown in FIG. 4, since characters at the addresses i=0, 4, 9 and 12 are matched with "A", the compared results m [i] of the comparing circuits 51(*i*) of the sets corresponding to the addresses i=0, 4, 9 and 12 go to "1" and the compared results m [i] of the comparing circuits 51(*i*) of the sets corresponding to the remaining addresses go to "0".

Also, in the aforementioned third retrieval (retrieval of the third character "C"), since the outputs ps [i] of the D flip-flop circuit 54(*i*) of the sets corresponding to the addresses i=2, 6, 11 and 14 are "1", outputs ps [i−1] supplied to the AND circuits 52(*i*) of the sets corresponding to the addresses i=3, 7, 12 and 15 just one address after the addresses i=2, 6, 11 and 14 are "1" and outputs ps [i−1] supplied to the AND circuits 52(*i*) of the remaining sets go to "0".

As a result, only the output ps_and_m [i] from the AND circuit 52(*i*) of the set corresponding to the address i=12 goes to "1" and the outputs ps_and_m [i] (match) from the AND circuits 52[*i*] of the remaining sets go to "0".

Then, since one output ps_and_m [i] is "1" so that the output orfb from the OR circuit 55 goes to "1", the ps_and_m [i] is selected by the multiplexers 53(*i*) and their outputs ps_and_m [ii] are held at the output terminals Q of the respective D flip-flip circuits 54(*i*). In this manner, the match address 12 of the character string matched with the character string "ABCA" can be obtained as earlier noted with reference to FIG. 1.

FIG. 4 shows the example in which the character string matched with the character string "ABCA" exists in the dictionary. However, unless the character string matched with the character string "ABCA" exists in the dictionary (that is, if the outputs ps_and_m [i] from the AND circuits 52(*i*) of all sets go to "0"), then the output orfb from the OR circuit 55 goes to "0" so that the outputs m [i] are selected by the respective D flip-flop circuits 54(*i*). These outputs m [i] are held at the output terminals Q of the D flip-flop circuits 54 (*i*). As a result, retrieval of character strings is started again from the character "A" of the address "4" by the aforementioned processing character by character.

The character string retrieving circuit shown in FIG. 2 supplies the output orfb of the OR circuit 55 to the multiplexers 53(*i*) of the respective sets without delay and therefore this character string retrieving circuit is called a circuit with "delay 0".

[Cited Patent Reference 1]: Republished Patent Application of International Publication Number W02003/032296 (pages 12 to 13, FIGS. 3 and 4)

The character string retrieving circuit shown in FIG. 2 is unsuitable for making the character string retrieving processing faster due to the following reasons. That is, this character string retrieving circuit has a loop structure in which the outputs ps [i] from the D flip-flop circuits 54(*i*) are fed through the AND circuits 52(*i*) and the OR circuit 55 back to the D flip-flop circuits 54(*i*) and hence high-speed operation of this loop becomes the necessary condition for making the character string retrieving circuit become faster. However, the OR circuit 55 which generates the output orfb is a complex combinational circuit and it has a large delay. As a result, this loop becomes a critical path (path having the largest delay). For this reason, the maximum frequency of the operation clock is limited by this loop and therefore this character string retrieving circuit is unsuitable for making the character string retrieving processing become faster.

As a general method for increasing an operation speed of a circuit, there is known a method for realizing a pipeline processing by inserting a delay means such as a flip-flop circuit into the circuit. However, in the character string retrieving circuit shown in FIG. 2, when a flip-flop circuit is simply provided at the rear stage of the OR circuit 55 so as to delay the output orfb, it is unavoidable that "algorithm in which the retrieved result in each clock period is used in the next clock period" is changed to a different algorithm. As a result, the character string retrieving circuit becomes unable to operate as it is intended to operate.

SUMMARY OF THE INVENTION

In view of the aforesaid aspects, the present invention intends to provide a character string retrieving circuit provided within a data compressing circuit using a LZ77.

The present invention intends to provide a character string retrieving circuit for retrieving a character matched with a character of an inputted character string from a dictionary at every period of an operation clock, creating a match/no match signal indicating whether or not a character matched with a retrieval target character exists in a dictionary and incrementing the number of retrieval target characters one by one by using the retrieved result in the next clock period if the character matched with the retrieval target character exists in the dictionary, this character string retrieving circuit being capable of making character string retrieval become faster by using pipe line processing.

According to an aspect of the present invention, there is provided a character string retrieving circuit for retrieving a character matched with a character of an inputted character string at every one period of an operation clock from a dictionary, creating a match/no match signal indicating whether or not a character matched with a retrieval target exists in a dictionary and incrementing the number of characters of the retrieval target one by one by using the retrieved result in the next clock period if the character matched with the retrieval target exists in the dictionary. This character string retrieving circuit is composed of a delay circuit for delaying the match/no match signal by n periods (n is an integer greater than 1) of the operation clock, creating circuits for creating in advance signals of $2^n$ kinds consisting of combinations of assumption to assume that a character matched with a retrieval target exists in the dictionary and assumption to assume that a character matched with a retrieval target does not exist in the dictionary in each period from the n−1 period before the clock period to the clock period as signals to predict retrieved results in a certain clock period and a selecting circuit for selecting a signal with a correct assumption from the signals of $2^n$ kinds created by the creating circuits in accordance with the match/no match signal delayed by the delay circuit, wherein the signal selected by the selecting circuits is used in the next clock period.

In this character string retrieving circuit, the match/no match signal (signal like the output orfb shown in FIG. 2) indicating whether or not a character matched with a character to be retrieved exists in the dictionary is delayed by n clock periods. Also, as a signal to predict a retrieved result in a certain clock period, there are created in advance signals of $2^n$ kinds of combinations of assumptions to assume that character strings matched with character strings to be retrieved in each period ranging from a n−1 period before the clock period to the clock period exist in the dictionary and assumptions to assume that character strings do not exist in the dictionary.

Then, one signal with correct assumption is selected from the signals of $2^n$ kinds in accordance with this delayed match/no match signal and the thus selected signal is used in the next clock period.

As a result, without changing the algorithm "the retrieved result in each clock period is used in the next clock period", the signal indicating the match/no match result like the output orfb shown in FIG. 2 is delayed and hence it is possible to realize faster character string retrieval based on the pipeline processing.

In accordance with another aspect of the present invention, there is provided a character string retrieving method for retrieving a character matched with a character of an inputted character string at every one period of an operation clock from a dictionary, creating a match/no match signal indicating whether or not a character matched with a retrieval target exists in a dictionary and incrementing the number of characters of the retrieval target one by one by using the retrieved result in the next clock period if the character matched with the retrieval target exists in the dictionary. This character string retrieving method is comprised of the steps of a first step for delaying the match/no match signal by n periods (n is an integer greater than 1) of the operation clock, a second step for creating in advance signals of $2^n$ kinds consisting of combinations of assumption to assume that a character matched with a retrieval target exists in the dictionary and assumption to assume that a character matched with a retrieval target does not exist in the dictionary in each period from the n−1 period before the clock period to the clock period as signals to predict retrieved results in a certain clock period and a third step for selecting a signal with a correct assumption from the signals of $2^n$ kinds created by the second step in accordance with the match/no match signal delayed by the first step, wherein the signal selected by the third step is used in the next clock period.

According to this character string retrieval method, in exactly the same manner as the character string retrieving circuit according to the present invention, without changing the algorithm "the retrieved result in each clock period is used in the next clock period", the signal indicating the match/no match result like the output orfb shown in FIG. 2 is delayed and hence it is possible to realize faster character string retrieval based on the pipeline processing.

According to the present invention, in the character string retrieving circuit for retrieving a character string matched with an inputted character string from the dictionary by using the retrieved result in the preceding clock period to increment the number of characters one by one, it is possible to realize faster character string retrieval based on the pipeline processing.

BRIEF DESCRIPTION OF THE DRAWINGS

FIG. 1 is a schematic diagram showing an example of a manner in which a character string is retrieved from a dictionary in a LZ77 method according to the related art;

FIG. 3 is a diagram showing the character string retrieving circuit shown in FIG. 2 by using a hardware description language according to the related art;

FIG. 7 is a diagram showing the character string retrieving circuit shown in FIG. 6 by using a hardware description language;

FIG. 8 is a schematic diagram showing operations of the character string retrieving circuit shown in FIG. 6;

FIG. 9 is a schematic diagram showing a principle to increase a speed at which a character string retrieving circuit with a "delay 2" can retrieve character strings; and FIG. 10 is a diagram showing the character string retrieving circuit with the "delay 2" by using a hardware description language.

DESCRIPTION OF THE PREFERRED EMBODIMENTS

An example in which the present invention is applied to a character string retrieving circuit provided within a data compressing circuit using a LZ77 method will be described in concrete below with reference to the drawings.

[Circuit with Delay 1]

Figure 2:
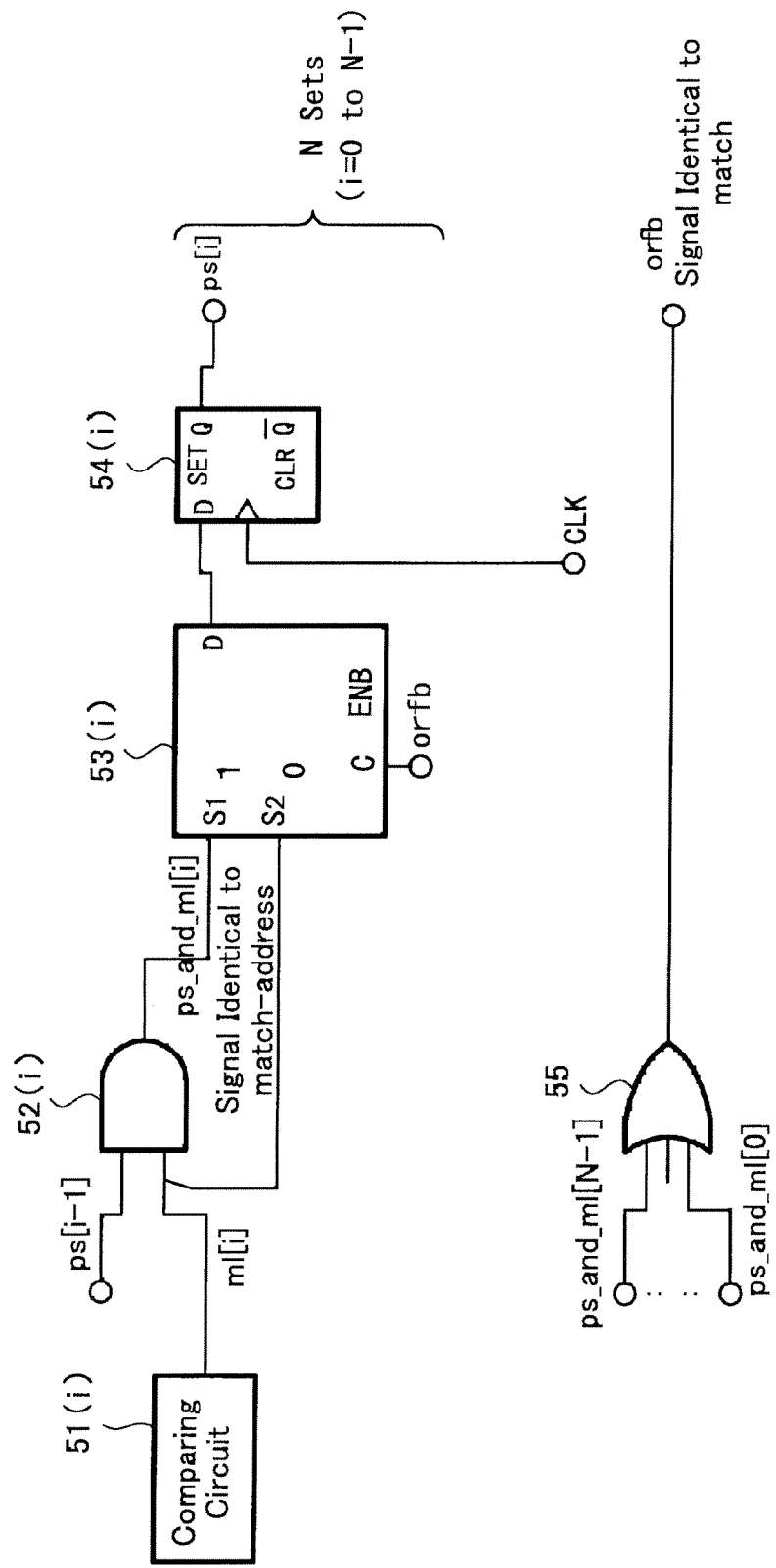
FIG. 2 is a block diagram showing an arrangement of a character string retrieving circuit provided within a data compressing circuit using a LZ77 method according to the related art.

First, assuming now the character string retrieving circuit shown in FIG. 2, a character string retrieving circuit (that is, circuit with a "delay 1") for delaying an output orfb created at each clock period by one clock period will be described below.

Figures 4, 5:
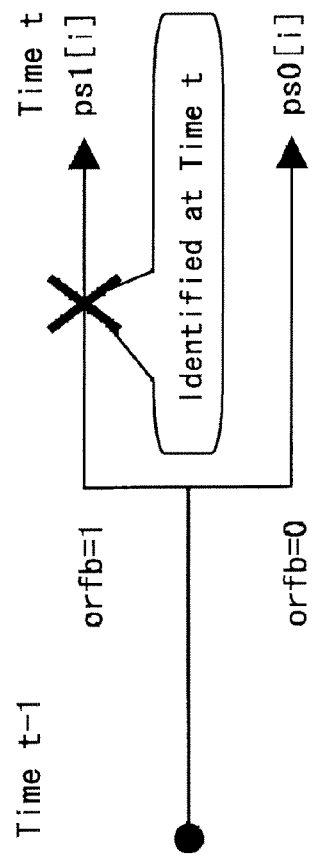
FIG. 4 is a schematic diagram showing operations of the character string retrieving circuit shown in FIG. 2.
FIG. 5 is a schematic diagram showing a principle to increase a speed at which a character string retrieving circuit with a "delay 1" can retrieve character strings.

FIG. 5 is a schematic diagram showing a principle to increase a speed at which the character string retrieving circuit with the "delay 1" can retrieve character strings. Since the output orfb takes only the two states of "1" or "0" (whether or not a match character string exists in a dictionary), signals of two kinds of a signal $ps1[i]$ to assume that the output orfb goes to "1" in the clock period and a signal $ps0[i]$ to assumes that the output orfb goes to "0" in the clock period are created in advance as signals that can predict retrieved results ps[i] in a certain clock period. In FIG. 5, a time t represents a time within a certain clock period and a time t−1 represents a time within the clock period in which the signals $ps1[i]$ and $ps0[i]$ are created.

Then, since it can be identified at the time t which of the assumptions of orfb="1" and orfb="0" is correct, one of the signals $ps1[i]$ and $ps0[i]$ which could obtain the correct predicted retrieved result is selected and the thus selected signal may be used in the next clock period. In the example shown in FIG. 5, it can be identified that the assumption of the output orfb="0" is correct, and hence the signal $ps0[i]$ is selected.

As a consequence, the output orfb in each period of the operation clock may be delayed by one clock period and it is possible to realize faster character string retrieval based on pipeline processing.

Figure 6:
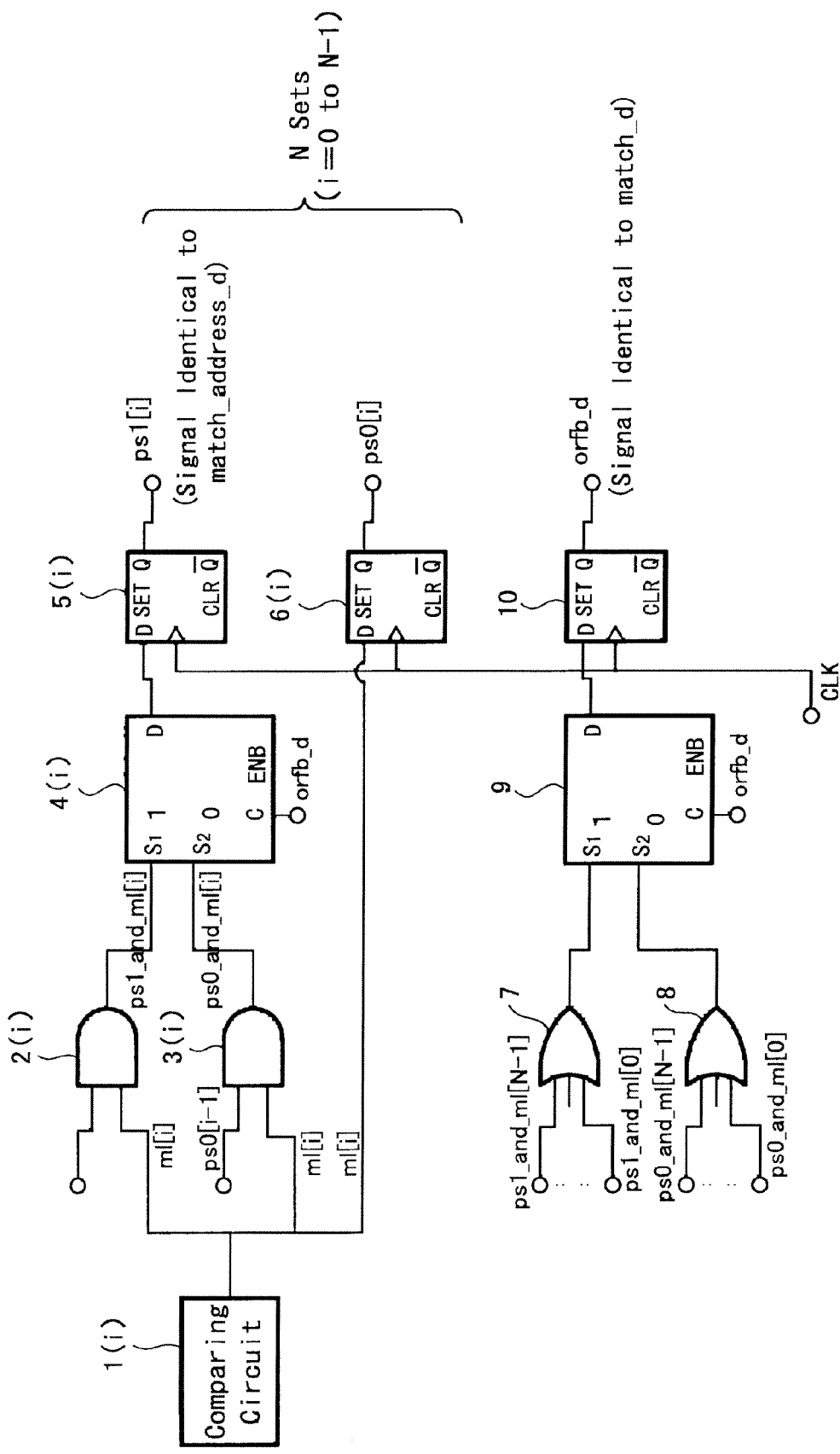
FIG. 6 is a block diagram showing an arrangement of a character string retrieving circuit to which the present invention is applied.

FIG. 6 is a block diagram showing an arrangement of this character string retrieving circuit with the "delay 1". As shown in FIG. 6, in response to addresses i (i=0 to N−1) of N-byte dictionary within a memory (for example, a SRAM (static random-access memory)), not shown, this character string retrieving circuit with the "delay 1" includes N sets of a circuit group consisting of comparing circuits $1(i)$, two-input and one-output AND circuits $2(i)$, two-input and one-input AND circuits $3(i)$, two-input and one-output multiplexers $4(i)$, D flip-flop circuits $5(i)$ and D flip-flop circuits $6(i)$.

Also, this character string retrieving circuit with the "delay 1" further includes an N-input and one-output OR circuit 7, an N-input and one-output OR circuit 8, a two-input and one-output multiplexer 9 to which outputs from the OR circuits 7 and 8 are supplied and a D flip-flop circuit 10 to which an output from the multiplexer 9 is supplied.

The comparing circuits $1(i)$ compare retrieval target characters and characters at the addresses i corresponding to the dictionary and output signals m [i] which go to "1" if they are matched with each other and which go to "0" if they are not matched with each other. The outputs m [i] are supplied to one input terminals of the AND circuits $2(i)$ and $3(i)$ of the same set and they are also supplied to D input terminals of the D flip-flop circuits $6(i)$ and thereby held at output terminals Q until the next input signal is supplied to the D flip-flop circuits $6(i)$.

Signals $ps1[i-1]$, which are the outputs of the flip-flop circuits $5(i)$ of the set corresponding to just one address before the address of the dictionary, are supplied to the other input terminals of the AND circuits $2(i)$. For example, if the AND circuit $2(i)$ is an AND circuit 2 (N−1), then a signal ps1 [N−2], which is an output from a D flip-flop circuit 5 [N−2], is supplied to the other input terminal of the AND circuit 2 (N−1). Outputs ps1_and_m [i] from the AND circuits $2(i)$ are supplied to an input terminal S1 of the multiplexer 4 of the same set and they are also supplied to the OR circuit 7.

Signals $ps0[i-1]$, which are the outputs from the flip-flop circuits $6(i)$ of the set corresponding to just one address before the address of the dictionary, are supplied to the other input terminals of the AND circuits $3(i)$. For example, if the AND circuit $3(i)$ is an AND circuit 2 (N−1), then a signal ps0 [N−2], which is an output from the flip-flop circuit 5 (N−2), is supplied to the other input terminal of the AND circuit 2 (N−1). Outputs ps0_and_m [1] from the AND circuits $3(i)$ are supplied to an input terminal S2 of the multiplexer 4 of the same set and they are also supplied to the OR circuit 8.

Outputs from the OR circuits 7 and 8 are respectively supplied to the input terminals S1 and S2 of the multiplexer 9, respectively. A signal outputted from the output terminal D of the multiplexer 9 is supplied to a D input terminal of the D flip-flop circuit 10 and it is held at the output terminal Q of the D flip-flop circuit 10 until the next input signal is supplied thereto. An output from this D flip-flop circuit 10 is supplied to a selection control terminal C of the multiplexer 9 as an output orfb_d which results from delaying the output orfb (that is, an output indicative of whether or not a character string which is matched with a retrieval target character string exists in the dictionary) in each clock period by one clock period. The output orfb_d from this D flip-flop circuit 10 is also supplied to the selection control terminals C of the multiplexers $4(i)$ of the respective sets.

If this output orfb_d is "1" (that is, if any character string that is matched with the retrieval target character string of just one clock period before exists in the dictionary), then the multiplexer 9 selects the output supplied to its input terminal S1 from the OR circuit 7 as a retrieved result in the clock period of this time and the multiplexer 9 outputs the selected output from its output terminal D. If on the other hand this output orfb_d is "0" (that is, unless any character string that is matched with the retrieval target character string of just one clock period before exists in the dictionary), then the multiplexer 9 selects the output supplied to its input terminal S2 from the OR circuit 8 as a retrieved result in the clock period of this time and the multiplexer 9 outputs the selected output from its output terminal D.

If this output orfb_d is "1" (that is, if any character string that is matched with the retrieval target character string of just one clock period before exists in the dictionary), then the multiplexers $4(i)$ select the output signals ps1_and_m[i] supplied to the input terminals S1 and they output the selected outputs from the output terminals D thereof. If on the other hand this output orfb_d is "0" (that is, unless any character string that is matched with the retrieval target character string of just one clock period before exists in the dictionary), then the multiplexers $4(i)$ select the outputs ps0_and_m [i] supplied to the input terminals S2 and output the selected output ps0_and m [i] from the output terminals D.

Outputs from the multiplexers $4(i)$ are supplied to D input terminals of the D flip-flop circuits $5(i)$ of the same set and they are held at the output terminals Q until the next signal is inputted thereto. The outputs $ps1[i]$ held at the output terminals Q of the D flip-flop circuits $5(i)$ are supplied to the AND circuits 2(*i*) of the set corresponding to one address after the dictionary as outputs ps1[*i*−1] as mentioned hereinbefore.

The outputs ps0[*i*] held at the output terminals Q of the D flip-flop circuits 6(*i*) are supplied to the AND circuits 2(*i*) of the set corresponding to one address after the dictionary as the outputs ps0[*i*−1] as mentioned hereinbefore.

While FIG. 6 shows the block diagram of the character string retrieving circuit according to the present invention, when the character string retrieving circuit according to the present invention is designed as the ASIC (Application Specific Integrated Circuit) or the programmable logic device (for example, FPGA (Field Programmable Gate Array), etc.), this character string retrieving circuit can be described as shown in FIG. 7 by using a Verilog HDL which is a kind of hardware description languages.

In this character string retrieving circuit, the output orfb in each period of the operation clock is delayed by one clock period. Then, the signals of two kinds of the retrieved result prediction output (outputs ps1[*i*] of the D flip-flop circuits 5(*i*)) to assume that the output orfb goes to "1" (orfb="1") in the clock period and the retrieved result prediction output (outputs ps0[*i*] of the D flip-flop circuits 6(*i*)) to assume that the output orfb goes to "0" (orfb="0") in the clock period are created in advance as signals to predict the retrieved results of the character string in a certain clock period before one period of the clock period. The outputs ps1[*i*] and ps0[*i*] are respectively supplied to the AND circuits 2(*i*) and 3(*i*) of the sets corresponding to one address after the dictionary as outputs ps1[*i*−1] and ps0[*i*−1].

Then, if the correct assumption is identified as the outputs orfb_d one clock period later, then the multiplixers 4(*i*) select outputs of the AND circuits 2(*i*) or 3(*i*) to which the correct retrieved result prediction output is supplied. The multiplexer 9 also selects the output corresponding to the correct retrieved result prediction output from the OR circuit 7 or 8.

Then, the signals selected by the multiplexers 4(*i*) are supplied through the D flip-flop circuits 5(*i*) to the AND circuits 2(*i*) of the sets corresponding to the one address after the dictionary as outputs ps1[*i*−1] and thereby the outputs ps1[*i*−1] can be used in the next clock period.

Specifically, if a newly inputted character string is "ABCA", for example, this character string retrieving circuit can retrieve character strings every time (at one period of the operation clock) in accordance with the following procedure.

<First Period>

The comparing circuits 1(*i*) obtain compared results m [i] with respect to the first character "A". The compared results m [i] are outputted from the D flip-flop circuits 6(*i*) as outputs ps0[*i*]. In the next period, the outputs ps0[*i*] are supplied to the AND circuits 3(*i*) of the sets corresponding to one address after the dictionary as outputs ps0[*i*−1].

<Second Period>

The comparing circuits 1(*i*) obtain compared results m [i] with respect to the second character "B". At that time, outputs from the AND circuits 3(*i*) become signals to predict retrieved results of "AB" and which assume that a character matched with the character "A" exists in the dictionary. Then, since the outputs orfb_d are not yet supplied to the multiplexers 4(*i*) (that is, signals "0" are supplied to the multiplexers 4(*i*)), the retrieved result prediction output of "AB" is selected by the multiplexers 4(*i*) and they are outputted from the D flip-flop circuits 5(*i*) as the outputs ps1[*i*]. In the next period, the outputs ps1[*i*] are supplied to the AND circuits 2(*i*) of the sets corresponding to one address after the dictionary as the outputs ps1[*i*−1].

Also, the compared results m [i] are outputted from the D flip-flop circuits 6(*i*) as the outputs ps0[*i*]. In the next period, the outputs ps0[*i*] are supplied to the AND circuits 3(*i*) of the sets corresponding to one address after the dictionary as outputs ps0[*i*−1]. The outputs ps0[*i*] become the signals indicating retrieved results obtained when the retrieval is again started from the second character "B" on the assumption that no character matched with the character "A" exists in the dictionary.

<Third Period>

The comparing circuits 1(*i*) obtain compared results m (i) with respect to the third character "C". At that time, outputs from the AND circuits 2(*i*) become signals to predict retrieved results of "ABC" and which assume that characters matched with the characters "AB" exist in the dictionary.

Also, the outputs from the AND circuits 3(*i*) become signals to predict retrieved results of "BC" and which assume that no characters matched with the characters "AB" exist in the dictionary.

In the third period, the output orfb_d indicating whether or not a character string matched with the character "A" exists in the dictionary is outputted from the D flip-flop circuit 10.

If the output orfb_d is "1", then it can be considered that the assumption to assume that the character matched with the character "A" exists on the dictionary is correct. Hence, outputs (retrieved result predicted outputs of "ABC") from the AND circuits 2(*i*) are selected by the multiplexers 4(*i*). The multiplexer 9 also selects the output of the OR circuit 7.

The retrieved result predicted outputs of "ABC" are outputted from the D flip-flop circuits 5(*i*) as the outputs ps1[*i*]. In the next period, the outputs ps1[*i*] are supplied to the AND circuits 2(*i*) of the sets corresponding to one address after the dictionary as outputs ps1[*i*−1].

If on the other hand the output orfb_d is "0", then it can be considered that the assumption to assume that no character matched with the character "A" exists on the dictionary is correct. Hence, outputs (retrieved result predicted outputs of "BC") from the AND circuits 3(*i*) are selected by the multiplexers 4(*i*). The multiplexer 9 also selects the output of the OR circuit 8.

The retrieved result predicted outputs of "BC" are outputted from the D flip-flop circuits 5(*i*) as the outputs ps1[*i*]. In the next period, the outputs ps1[*i*] are supplied to the AND circuits 2(*i*) of the sets corresponding to one address after the dictionary as outputs ps1[*i*−1].

Also, the compared results m [i] are outputted from the D flip-flop circuits 6(*i*) as the outputs ps0[*i*]. In the next period, the outputs ps0[*i*] are supplied to the AND circuits 2(*i*) of the sets corresponding to one address after the dictionary as outputs ps1[*i*−1]. The outputs ps0[*i*] become the signals indicating retrieved results obtained when the retrieval is again started from the third character "C" on the assumption that no character matched with the character "B" exists in the dictionary.

<Fourth Period>

The comparing circuits 1(*i*) obtain compared results m (i) with respect to the fourth character "A".

At that time, outputs from the AND circuits 3(*i*) become signals to predict retrieved results of "CA" and which assume that no characters matched with the characters "ABC" exists in the dictionary.

Also, in the third period, if the outputs orfb_d are "1", then in this fourth period, the outputs from the AND circuits 2(*i*) become signals to predict retrieved results of "ABCA" and which assume that characters matched with the characters "ABC" exist on the dictionary. Then, in the fourth period, the output orfb_d indicating whether or not a character string matched with "AB" exists in the dictionary is outputted from the D flip-flop circuit 10.

If the output orfb_d is "1", then it can be considered that the assumption to assume that the characters matched with the character "AB" exist on the dictionary is correct. Hence, outputs (retrieved result predicted outputs of "ABCA") from the AND circuits 2(*i*) are selected by the multiplexers 4(*i*). The multiplexer 9 also selects the output of the OR circuit 7.

The retrieved result predicted outputs of "ABCA" are outputted from the D flip-flop circuits 5(*i*) as the outputs ps1[*i*]. In the next period, the outputs ps1[*i*] are supplied to the AND circuits 2(*i*) of the sets corresponding to one address after the dictionary as outputs ps1[*i*−1].

If on the other hand the output orfb_d is "0", then it can be considered that the assumption to assume that no characters matched with the character "AB" exist on the dictionary is correct. Hence, outputs (retrieved result predicted outputs of "CA") from the AND circuits 3(*i*) are selected by the multiplexers 4(*i*). The multiplexer 9 also selects the output of the OR circuit 8.

The retrieved result predicted outputs of "CA" are outputted from the D flip-flop circuits 5(*i*) as the outputs ps1[*i*]. In the next period, the outputs ps1[*i*] are supplied to the AND circuits 2(*i*) of the sets corresponding to one address after the dictionary as outputs ps1[*i*−1].

Also, the compared results m [i] are outputted from the D flip-flop circuits 6(*i*) as the outputs ps0[*i*]. In the next period, the outputs ps0[*i*] are supplied to the AND circuits 2(*i*) of the sets corresponding to one address after the dictionary as the outputs ps1[*i*−1]. The outputs ps0[*i*] become the signals indicating retrieved results obtained when the retrieval is again started from the fourth character "A" on the assumption that no character matched with the character "C" exists in the dictionary.

FIG. 8 is a schematic diagram showing retrieval operations of this fourth period with reference to the example of the aforementioned dictionary shown in FIG. 1. That is, FIG. 8 shows the case in which the character string "ABCA" is retrieved by using the retrieved result prediction of "ABC".

As shown in FIG. 8, since characters at the addresses i=0, 4, 9 and 12 are matched with the character "A", the compared results m [i] of the comparing circuits 1(*i*) of the sets corresponding to the addresses i=0, 4, 9 and 12 go to "1" and the compared results m [i] of the comparing circuits 1(*i*) of the remaining sets go to "0".

Although it is not yet identified whether or not characters matched with the character string "ABC" exist in the dictionary, since the outputs ps1[*i*−1] are the retrieved results assuming that characters matched with the character string "ABC" exist in the dictionary (that is, the outputs ps1[*i*] from the D flip-flop circuits 5(*i*) of the sets corresponding to the addresses i=2, 6, 11 and 14 are "1" in the retrieval of the third period), similarly to the outputs ps [i−1] shown in FIG. 3, the outputs ps1[*i*−1] supplied to the AND circuits 2[*i*] of the sets corresponding to addresses i=3, 7, 12 and 15 just one address after the addresses ii=2, 6, 11 and 14 go to "1" and the outputs ps1[*i*−1] supplied to the AND circuits 2(*i*) of the remaining sets go to "0".

As a result, similarly to the outputs ps [i] shown in FIG. 3, the outputs from the AND circuit 2(*i*) of the set corresponding to the address i=12 go to "1" and the outputs from the AND circuit 2(*i*) of the remaining sets go to "0". Then, if the output orfb_d is "1", then the AND circuits 2(*i*) become the outputs ps1[*i*] of the D flip-flop circuits 5[*i*] so that the outputs ps1[*i*] of the D flip-flop circuits 5(*i*) of the sets corresponding to the address i=12 go to "1" and that the outputs ps1[*i*] of the remaining sets go "1".

The outputs ps0[*i*−1] show the results obtained when the third character "C" in the set corresponding to one address before was retrieved again. The outputs ps1[*i*−1] show the results obtained when the fourth character "A" was retrieved again.

In the third period, if the outputs orfb_d are "0", then in this fourth period, the outputs of the AND circuits 2(*i*) become signals which may predict the retrieved results of the character string "BCA". Then, in this fourth period, the output ordb_d which indicates whether or not a character string matched with "B" exists in the dictionary is outputted from the D flip-flop circuit 10.

If the outputs orfb_d are "1", then the multiplexers 4(*i*) select the outputs (retrieved result predictions of "BCA") of the AND circuits 2(*i*) (the multiplexer 9 also selects the output of the OR circuit 7).

The retrieved result predictions of "BCA" are outputted from the D flip-flop circuits 5(*i*) as the outputs ps1[*i*]. In the next period, the outputs ps1[*i*] are supplied to the AND circuits 2(*i*) of the sets corresponding to one address after the dictionary as the outputs ps1[*i*−1].

If on the other hand the outputs orfb_d are "0", then the multiplexers 4(*i*) select the outputs (retrieved result predictions of "CA") of the AND circuits 3(*i*) (the multiplexer 9 also selects the output of the OR circuit 8).

The retrieved result predictions of "CA" are outputted from the D flip-flop circuits 5(*i*) as the outputs ps1[*i*]. In the next period, the outputs ps1[*i*] are supplied to the AND circuits 2(*i*) of the set corresponding to one address after the dictionary as the outputs ps1[*i*−1].

In the fifth period following the fourth period, the orfb_d which indicate whether or not a character string matched with "ABC" exists in the dictionary is outputted from the D flip-flop circuit 10. When the character string "ABCA" is followed by the input character string, similar processing will be also effected on each period after the fifth period in response to the value of the orfb_d.

As described above, according to this character string retrieving circuit, without changing the algorithm "retrieved result in each clock period is used in the next clock period", it is possible to realize faster character string retrieval based on pipeline processing by delaying the output orfb (match/no match signal indicative of whether or not a character matched with a retrieval target character exists in a dictionary) created in each clock period.

In addition, since only the two kinds of the signals to predict retrieved results may be created and the output orfb may be delayed by one clock period, it is possible to simplify the circuit arrangement (when this character string retrieving circuit is designed as the ASIC or the programmable logic device by using the hardware description language, it is possible to simplify logic devices).

[Circuit with Delay 2]

Next, assuming the character string retrieving circuit shown in FIG. 2, a character string retrieving circuit (circuit with a "delay 2") which delays the output orfb by two clock periods will be described below.

FIG. 9 is a schematic diagram showing a principle to increase a speed at which the character string retrieving circuit with the "delay 2" can retrieve character strings. Since the output orfb takes only the two states of "1" or "0" (whether or not a match character string exists in a dictionary), the signals of four kinds of a signal ps11[$i$] to assume that the output orfb goes to "1" (orfb="1") in the clock period and that the output orfb goes to "1" (orfb="1"), a signal ps10[$i$] to assumes that the output orfb goes to "0" (orfb="0") in the clock period and that the output orfb goes to "1" (orfb="1") in the clock period of one period before, a signal ps01[$i$] to assume that the output orfb goes to "1" (orfb="1") in the clock period and that the output orfb goes to "0" (orfb="0") in the clock period of one period before and a signal ps00[$i$] to assume that the output orfb goes to "0" (orfb="0") in the clock period and that the output orfb goes to "0" (orfb="0") in the clock period of one period before are created in advance as signals that can predict retrieved results ps [$i$] in a certain clock period. In FIG. 9, a time t represents a time within a certain clock period, a time t−1 represents a time within the clock period of one period before the clock period and a time t−2 represents a time within the clock period in which the signals ps11[$i$] and ps00[$i$] are created.

Then, since it can be identified at the time t which of the assumptions of orfb="1" and orfb="0" is correct, the correct set of the set of the retrieved result predictions ps11[$i$] and ps10[$i$] and the set of ps01[$i$] and ps00[$i$] may be selected and the selected signals may be used in the next clock period. In the example shown in FIG. 9, since it can be identified that the assumption of orfb="0" is correct with respect to the first clock period, the set of ps01[$i$] and ps00[$i$] should be selected.

As a result, it is possible to realize the faster character string retrieval based on the pipeline processing by delaying the output orfb in each clock period by 2 clock periods.

When this character string retrieving circuit is designed as the ASIC (Application Specific Integrated Circuit) or the programmable logic device (FPGA (Field Programmable Gate Array), this character string retrieving circuit with the "delay 2" can be described by using the Verilog HDL which is a kind of the hardware description language, as shown in FIG. 10.

While the character retrieving circuits in which the output orfb is delayed by one clock period or two clock periods have been described so far in the above embodiments, the present invention is not limited to the above-mentioned embodiments. In general, if signals of $2^n$ kinds consisting of combinations of assumptions of the values of the outputs orfb in each period from the clock period of the n−1 period before (n is an integer greater than 1) the clock period to the clock period are created in advance as the signals to predict the retrieved results in a certain clock period, then the output orfb in each clock period can be delayed by n clock periods and the faster character string retrieval can be realized based on the pipeline processing.

While the present invention was applied to the character string retrieving circuit provided within the data compressing circuit using the LZ77 method in the above-mentioned embodiments, the present invention is not limited thereto and can be applied to the faster character string retrieval in all sorts of character string retrieving circuits in which retrieval processing for retrieving a character string matched with the inputted character string from a dictionary is effected on each character of this character string at every period of an operation clock and in which the retrieved result in each clock period is used in the next clock period.

According to the present invention, in the character string retrieving circuit for retrieving a character string matched with an inputted character string from the dictionary by using the retrieved result in the preceding clock period to increment the number of characters one by one, it is possible to realize faster character string retrieval based on the pipeline processing.

It should be understood by those skilled in the art that various modifications, combinations, sub-combinations and alterations may occur depending on design requirements and other factors insofar as they are within the scope of the appended claims or the equivalents thereof.

What is claimed is:

1. A character string retrieving circuit for retrieving a character matched with a character of an inputted character string at every one period of an operation clock from a dictionary, creating a match/no match signal indicating whether or not a character matched with a retrieval target exists in a dictionary and incrementing the number of characters of the retrieval target one by one by using the retrieved result in the next clock period if the character matched with the retrieval target exists in the dictionary, comprising:
    delay means for delaying said match/no match signal by n periods (n is an integer greater than 1) of said operation clock;
    creating means for creating in advance signals of $2^n$ kinds consisting of combinations of assumption to assume that a character matched with a retrieval target exists in said dictionary and assumption to assume that a character matched with a retrieval target does not exist in said dictionary in each period from the n−1 period before the clock period to the clock period as signals to predict retrieved results in a certain clock period; and
    selecting means for selecting a signal with a correct assumption from said signals of $2^n$ kinds created by said creating means in accordance with said match/no match signal delayed by said delay means, wherein the signal selected by said selecting means is used in the next clock period.

2. A character string retrieving circuit according to claim 1, wherein said delay means delays said match/no match signal by one period of said operation clock, said creating means creating signals of two kinds of a signal to assume that a character matched with a retrieval target exists in a dictionary in a clock period and a signal to assume that a character matched with a retrieval target does not exist in the dictionary in the clock period as signals to predict retrieved results in a certain clock period.

3. A character string retrieving method for retrieving a character matched with a character of an inputted character string at every one period of an operation clock from a dictionary, creating a match/no match signal indicating whether or not a character matched with a retrieval target exists in a dictionary and incrementing the number of characters of the retrieval target one by one by using the retrieved result in the next clock period if the character matched with the retrieval target exists in the dictionary, comprising the steps of:
    a first step for delaying said match/no match signal by n periods (n is an integer greater than 1) of said operation clock;
    a second step for creating in advance signals of $2^n$ kinds consisting of combinations of assumption to assume that a character matched with a retrieval target exists in said dictionary and assumption to assume that a character matched with a retrieval target does not exist in said dictionary in each period from the n−1 period before the clock period to the clock period as signals to predict retrieved results in a certain clock period; and
a third step for selecting a signal with a correct assumption from said signals of $2^n$ kinds created by said second step in accordance with said match/no match signal delayed by said first step, wherein the signal selected by said third step is used in the next clock period.

* * * * *